United States Patent [19]
Fukunaga et al.

[11] Patent Number: 6,106,319
[45] Date of Patent: Aug. 22, 2000

[54] ELECTRICAL CONNECTING DEVICE

[75] Inventors: Masami Fukunaga; Kentaro Mori, both of Kawaguchi, Japan

[73] Assignee: Enplas Corporation, Saitama-ken, Japan

[21] Appl. No.: 09/077,150
[22] PCT Filed: Sep. 10, 1997
[86] PCT No.: PCT/JP97/03649
　§ 371 Date: May 22, 1998
　§ 102(e) Date: May 22, 1998
[87] PCT Pub. No.: WO99/19945
　PCT Pub. Date: Apr. 22, 1999

[51] Int. Cl.⁷ .................................................. H01R 13/625
[52] U.S. Cl. ............................................ 439/342; 439/331
[58] Field of Search .................................. 439/68, 72, 71, 439/73, 265–268, 330, 331, 342

[56] References Cited

U.S. PATENT DOCUMENTS 5,807,127  9/1998  Ohshima ................................. 439/266

FOREIGN PATENT DOCUMENTS 8-273786  10/1996  Japan .

*Primary Examiner*—Khiem Nguyen
*Attorney, Agent, or Firm*—Fish & Richardson P.C.

[57] ABSTRACT

In an electrical connector, in which when an upper operation member 17 is vertically moved, a movable plate 14 is horizontally moved through an X-shaped link 18 to thereby displace a contact pin to separate the contact pin from and contact it to a terminal of one of electrical parts, a plurality of X-shaped links 18 are disposed with space at positions corresponding to side surface portions along the horizontally moving direction of the movable plate 14, lower end portions 23b of one link members 23 are pivotally connected to a socket body 13 and lower end portions 25a of another link members 25 are pivotally connected to the movable plate 14, upper end portions 25b of another link members 25 are pivotally connected to the supper operation member 17 and upper end portions 23c of one link members 23 are connected to the upper operation member 17 to be relatively movable in the horizontal direction thereof. Accordingly, even if an amount to be depressed of the upper operation member is increased, it is not necessary to make large the depressing force proportionally thereto, and moreover, the movable plate 14 can be correctly moved in the horizontal direction.

6 Claims, 17 Drawing Sheets

ELECTRICAL CONNECTING DEVICE

TECHNICAL FIELD

The present invention relates to a connector device for electrically connecting one electrical part such as semiconductor (called hereinlater "IC package") to another one electrical part.

BACKGROUND ART

As a device of the kind mentioned above, a prior art provides a device shown in FIGS. 18 and 19 (refer to Japanese Patent Publication No. HEI 6-30280). In this device, an upper operation member 1 is depressed downward by means of an automatic machine, whereby one 2 of the operation levers is pivoted about a shaft 2a and another one 3 of the operation levers is pivoted about a shaft 3a. According to such pivotal motions, coupling pins 2b and 3b of these operation levers 2 and 3 are moved respectively in arrowed directions, and accordingly, a movable plate 4 connected to these pins 2b and 3b is horizontally moved in a predetermined direction. According to the motion of the movable plate 4, upper end portions 6a of contact pins 6 disposed to a connector body 5 are elastically deformed and then displaced, so that a terminal 7a of an electrical part (for example, IC package) mounted on the movable plate 4 is inserted into an upper end portion 6a of the contact pin with no-load condition. Thereafter, when the depressing force applied to the upper operation member 1 is released, the upper operation member 1 moves upward, and at the same time, the movable plate 4 is pressed by a restoring force of the contact pin 6 in a direction reverse to that applied before and the contact pin 6 and the terminal 7a of the electrical part 7 are contacted, thus establishing the electrical connection therebetween.

In the connector of such structure mentioned above, since the movable plate 4 is horizontally moved by the depressing force of the upper operation member 1, a pair of levers 2 and 3 utilizing the principle of lever are used. Therefore, the depressing force of the upper operation member 1 necessary for separating the connection of the contact pin 6 can be somewhat reduced by utilizing the principle of lever. However, as the depressing amount of the upper operation member 1 is increased, the reaction force of the contact pin 6 is accordingly increased, so that an increasing large depressing force is required for the levers 2 and 3 utilizing the principle of lever as the depressing amount of the upper operation member 1 is increased, providing no good maneuverbility.

Furthermore, when it is required to reduce the depressing force, it becomes necessary to elongate the lengths of the levers 2 and 3, and accordingly, in a case where a problem of space limitation for locating the bilateral levers exists, there is a limit for reducing the depressing force. Still furthermore, in a case where it is required to make large a vertical motion amount of the upper operation member 1 without changing the moving amount of the movable plate 4, it becomes also necessary to elongate the lengths of the levers 2 and 3, and accordingly, in a case where space limitation for locating the bilateral levers exists, it is difficult to satisfy such requirement.

Still furthermore, in the structure utilizing the principle of lever, the coupling pins 2b and 3b connected to the movable plate 4 perform circular motions about the shafts 2a and 3a, so that the movable plate 4 cannot be exactly moved in the horizontal direction.

An object of the present invention is therefore to provide an electrical connector capable of exactly moving a movable plate in a horizontal direction.

Another object of the present invention is to provide an electrical connector capable of, in a case where space limitation exists, making small a depressing force, making large a vertically moving amount of an upper operation member without changing a horizontally moving amount of a movable plate, and improving the degree of design freedom.

DISCLOSURE OF THE INVENTION

To achieve the above objects, the present invention provides an electric connector in which a movable plate, which elastically deforms a contact pin when moved horizontally, is disposed to be horizontally movable on a connector body on which the contact pin is located, and an upper operation member is disposed to an upper side of the connector body to be vertically movable so that when the upper operation member is lowered, the movable plate is moved horizontally to thereby elastically deform the contact pin and then displace the same through an X-shaped link, whereby a terminal of electrical part is inserted with non-press contact state to the contact pin, and when the upper operation member is moved upward, the movable plate returns to an original position thereof and the elastic deformation of the contact pin is released, whereby the terminal of the electrical part and the contact pin are electrically contacted, and the electric connector being characterized in that the X-shaped link has substantially an X-shaped structure by pivotally connecting a pair of link members together and disposed to a portion corresponding to a body side surface portion normal to the horizontally moving direction of the movable plate and/or a body side surface portion parallel thereto, a lower end portion of one of the link members is connected to be pivotal to the connector body and a lower end portion of another one of the link members is pivotally connected to the movable plate, and one of upper end portions of both the link members is pivotally connected to the upper operation member.

According to the above characteristic features, since the X-shaped link constitutes a toggle joint, as the depressed amount of the upper operation member is increased, the force pressing the movable plate increases, and accordingly, even if the amount to be depressed of the upper operation member is increased, the movable plate can be horizontally moved without increasing the depressing force, thus providing an improved maneuverbility.

Furthermore, since the X-shaped link constitutes a toggle joint and vertically moving direction of the upper operation member is converted into the bilaterally moving direction of the lower end portion of another link member, the movable plate can be exactly horizontally moved in comparison with the prior art in which the movable plate 4 is moved horizontally by means of coupling pins 2b and 3b performing circular motions.

In another aspect of the present invention, it is characterized in that a pair of link members are pivotally connected so as to provide an X-shape structure and a plurality of the X-shaped links are disposed at portions corresponding to body side surface portions normal to the horizontally moving direction of the movable plate and/or body side surface portions parallel thereto, and a plurality of lower end portions of another ones of the link members are pivotally connected to the movable plate with space from each other.

According to such characteristic feature, since a plurality of the X-shaped links are disposed at portions corresponding to body side surface portions normal to the horizontally moving direction of the movable plate and/or body side surface portions parallel thereto, and the lower end portions of these link members are provided with space from each other, the forces from these lower end portions act on the movable plate in a dispersed manner to thereby Unstably move the movable plate in the horizontal direction in comparison with a case in which such forces are concentrated in one portion.

In a further aspect of the present invention, there is provided an electric connector in which a movable plate, which elastically deforms a contact pin when moved horizontally, is disposed to be horizontally movable on a connector body on which the contact pin is located, and an upper operation member is disposed to an upper side of the connector body to be vertically movable so that when the upper operation member is lowered, the movable plate is moved horizontally to thereby elastically deform the contact pin and then displace the same through a link mechanism, whereby a terminal of electrical part is inserted with non-press contact state to the contact pin, and when the upper operation member is moved upward, the movable plate returns to an original position thereof and the elastic deformation of the contact pin is released, whereby the terminal of the electrical part and the contact pin are electrically contacted, the electric connector being characterized in that the link mechanism has a structure in which a plurality of X-shaped links, each being composed of a pair of link members pivotally connected together at central portions thereof, are connected to each other in a plurality of stages, and are disposed at portions corresponding to body side surface portions normal to the horizontally moving direction of the movable plate and/or body side surface portions parallel thereto, and a lower end portion of one of the link members of the lowermost stage X-shaped link is pivotally connected to the connector body a lower portion of another one of the link members thereof is pivotally connected to the movable plate and one of upper end portions of the uppermost stage X-shaped link is pivotally connected to the upper operation member.

According to such characteristic features, since the depressing force can be made light even when the location space is limited, and moreover, the vertically moving amount of the upper operation member can be made large without changing the horizontally moving amount of the movable plate, thus improving the degree of design freedom.

In a still further aspect of the present invention, a plurality of link mechanisms are disposed at portions corresponding to side surface portions along horizontal movement of the rectangular movable member, and a plurality of lower end portions of another link members of the lowermost X-shaped link are pivotally connected to the movable plate with space from each other.

According to such characteristic feature, the X-shaped links are disposed to the side surface portions along the horizontally moving direction of the movable plate and the lower end portions of the link members of a plurality of link mechanisms are attached to the movable plate, the forces form these lower end portions act on the movable plate in a dispersed manner to thereby stably move the movable plate in the horizontal direction in comparison with a case in which such forces are concentrated in one portion.

In a still further aspect of the present invention, the X-shaped link has one link member to which a slit is formed and another one link member is inserted into the slit and then connected thereto to be pivotal by means of a central coupling pin.

According to such characteristic feature, since both the link members of the X-shaped link is constructed such that the other link member is inserted into the slit formed to the one link member and connected to be pivotal by the central coupling pin, when the force is transmitted between both the link members through the central coupling pin, the force acting on the central coupling pin is dispersed to two portions and the shearing force acting on the central coupling pin is dispersed. In this instance, the force can be stably transmitted without causing the bending moment to one of the link members through the central coupling pin.

In a still further aspect of the present invention, a plurality of positioning bosses are formed to the connector body so as to extend upward, the positioning bosses being inserted into idle insertion portions formed to the movable plate to be projected upward therefrom, upper end portions of the positioning bosses are fitted to an upper plate disposed so as to cover an upper side of the movable plate to thereby support the upper plate, a through hole, through which a terminal of the electrical part is inserted, is formed to the upper plate, and the idle insertion portion is set in size capable of allowing the movable plate to be horizontally movable without interfering with the positioning bosses.

According to this characteristic feature, the positioning bosses formed to the connector body are inserted into the idle insertion portions of the movable plate and are fitted into recessed portions of the upper plate to thereby support the upper plate, and the size of the idle insertion portion is determined so as to have a size capable of allowing the movable plate to be horizontally movable without interfering with the positioning bosses. Therefore, since it is not necessary to form a portion, outside the movable plate of the connector body, supporting the upper plate, the connector can be made compact.

In a still further aspect of the present invention, a lever is disposed to the connector body to be pivotal, the lever being rotated by a vertical movement of the upper operation member, and when the electrical part is placed to a correct position on the connector body, the lever locks the electrical part, whereas when the electrical part is placed to an incorrect position on the connector body, the lever does not lock the electrical part.

According to such characteristic feature, it can be easily detected, by observing the engaging state of the lever, whether the electrical part is placed on the correct position of the connector body or not. Furthermore, the electrical part can be held to the correct position against the external impact or vibration.

BEST MODE FOR EMBODYING THE INVENTION

Figure 1A:
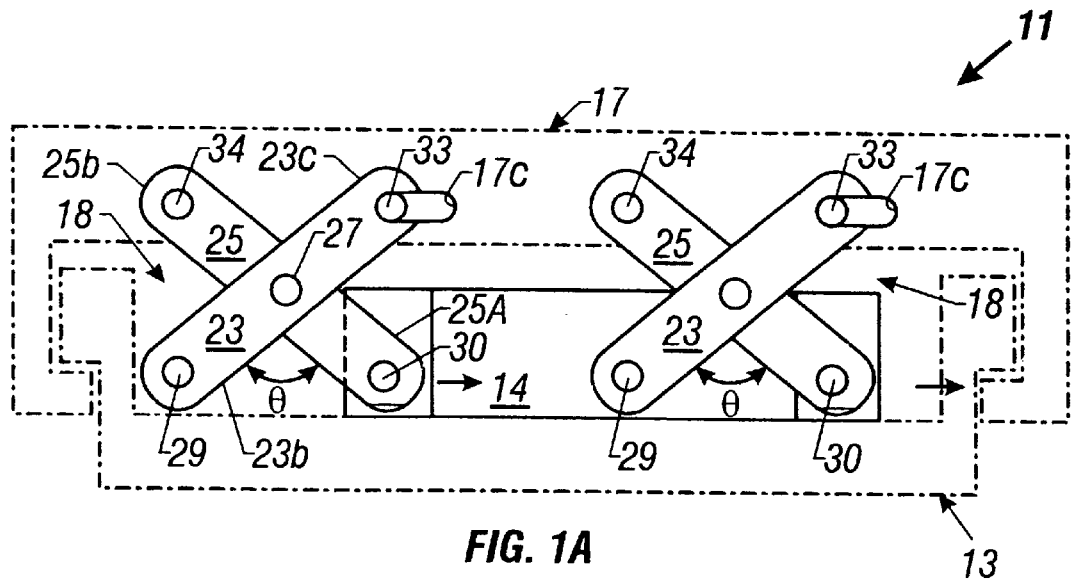
FIGS. 1a and 1b are schematic views showing a link mechanism of an IC socket according to a mode 1 for embodying the present invention, in which (a) shows a state before the lowering of an upper operation member and (b) shows a state in which the upper operation member is lowered.

The modes for embodying the present invention will be described hereunder.

[Mode 1 for Embodying The Invention]

FIGS. 1 to 9 represents a mode 1 (first embodiment) for embodying the present invention.

The structure of this embodiment is first described. Reference numeral 1 in the drawings denotes an IC socket as an "electrical connector", and the IC socket 11 is one for electrically connecting a spherical terminal 12b of an IC package 12 as "one electrical part" and a print wiring board, not shown, of a tester as "another one electrical part" for carrying out a performance test of the IC package 12.

The IC socket 11 is generally composed of a socket body 13 as a "connector body" mounted on a print wiring board, and a movable plate 14 having a rectangular shape is disposed on the socket body 13 to be horizontally movable in a predetermined direction. When the movable plate 14 is moved horizontally, a contact pin 19 disposed to the socket body 13 is elastically deformed. An upper plate 16 is disposed to an upper portion of the movable plate 14 in a manner fixed to the socket body 13 and an upper operation member 17 having a rectangular frame structure is disposed further on the upper portion of these members to be vertically movable. When the upper operation member 17 is moved vertically, the movable plate 14 is horizontally moved through an X-shaped link 18.

Figure 3:
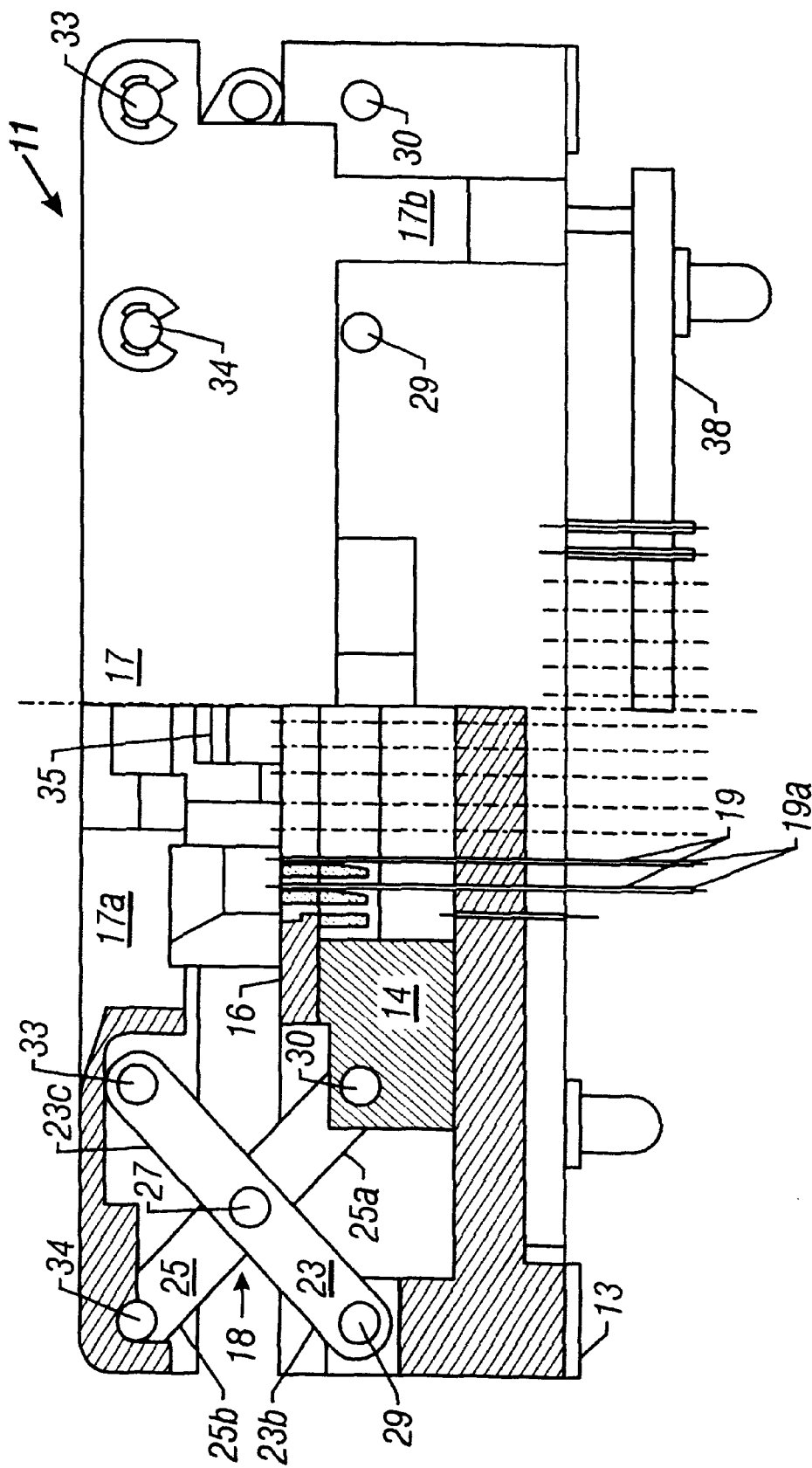
FIG. 3 is a front view of an IC socket according to the mode 1.
Figure 4:
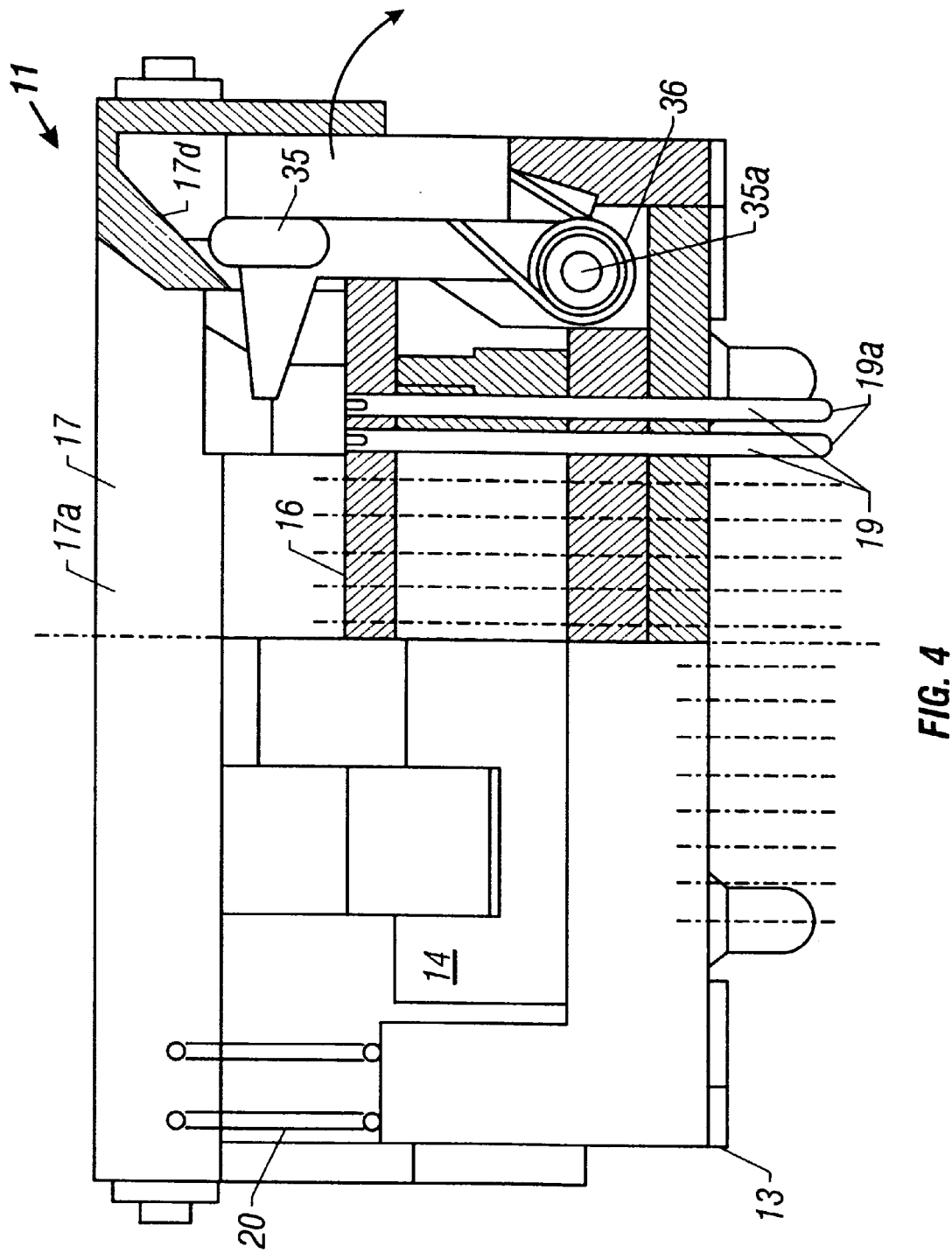
FIG. 4 is a right side view of FIG. 3 in connection with the mode 1.
Figure 5:
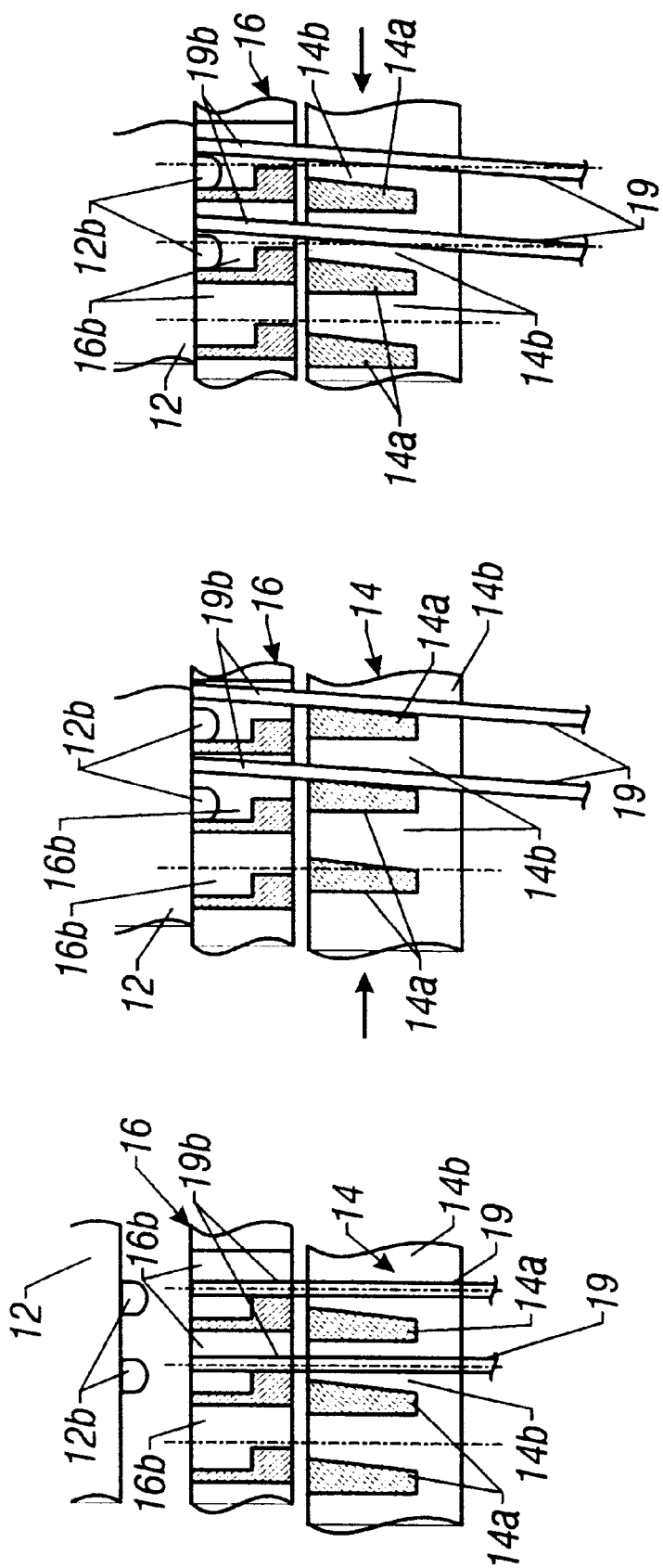
FIGS. 5a through 5c are sectional views showing a relationship between a movable member, contact pins and their associated members of the mode 1.

More concretely, a plurality of contact pins 19, each having an elastical property and formed in shape of a long plate of a material having excellent electrical conductivity, are press fitted into the socket body 13 as shown in FIGS. 3 through 5, and lead portions 19a extend downward from the lower surface of the socket body 13 so as to be electrically connected to the print wiring board. The upper portions of the contact pins 19 projecting over the supper surface of the socket body 13 are inserted into insertion portions 14b of the movable plate 14 and through holes 16b of the upper plate 16. When the movable plate 14 is moved from the state shown in FIG. 5(a) to the state reshown in FIG. 5(b) in the arrowed horizontal direction, the contact pins 19 are pressed by a pressing portion 14a of the movable plate 14 and hence elastically deformed and then displaced, whereby the spherical terminals 12b of the IC package 12 are inserted into the through holes 16b of the upper plate 16. Thereafter, when the movable plate 14 is returned to the state shown in FIG. 5(c) in the arrowed direction, the upper portions 19b of the contact pins 19 are contacted to the spherical terminals 12b of the IC package 12.

Figure 7A:
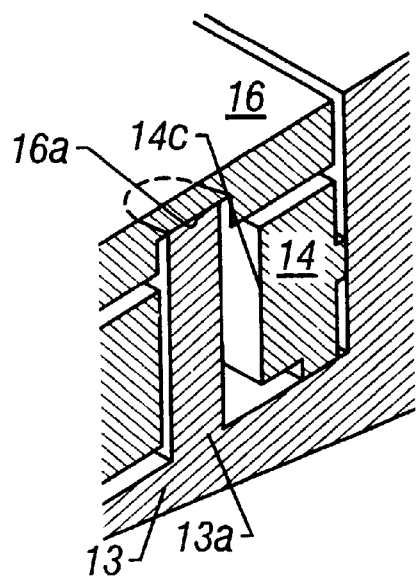
FIGS. 7a and 7b, are views showing positioning bosses, an upper plate and so on, in which (a) is a perspective view and (b) is a sectional view.
Figure 7B:
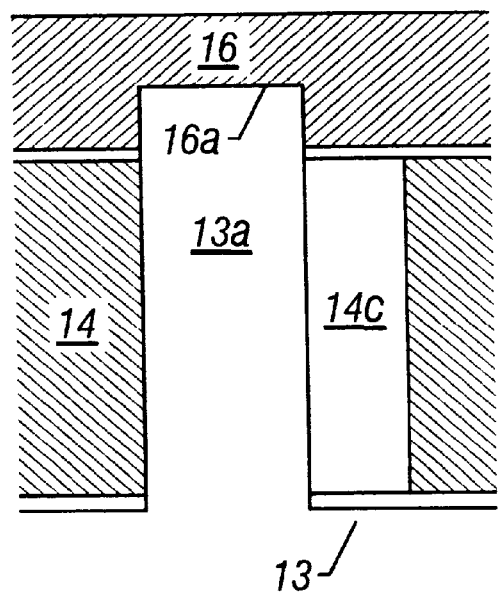

Furthermore, the upper plate 16 has a rectangular shape having four corner portions to which recesses 16a are formed respectively and the socket body 13 is formed with a plurality of positioning bosses 13a (only one boss is shown in FIG. 7) which are fitted to the recessed 16a so as to be disposed on the upper side of the movable member 14 with a state being fixed to the socket body 13 as shown in FIG. 7. The movable plate 14 is formed with insertion portions 14c into which the positioning bosses 13a are idly inserted and the size of the insertion portion 14c is decided so as to allow the movable member 14a to be horizontally movable without being interfered with the positioning boss 13a. The upper plate 16 is formed with a number of through holes 16b, into which the spherical terminals 12b of the IC package 12 are inserted, to positions corresponding to the insertion portions 14b of the movable plate 14, and as shown in FIGS. 2 and 3, the upper plate 16 is further formed with four guide portions 16c for performing positioning operation at the time of mounting the IC package 12 at the corresponding respective corner portions of the IC package 12 so as to project therefrom.

Figure 2:
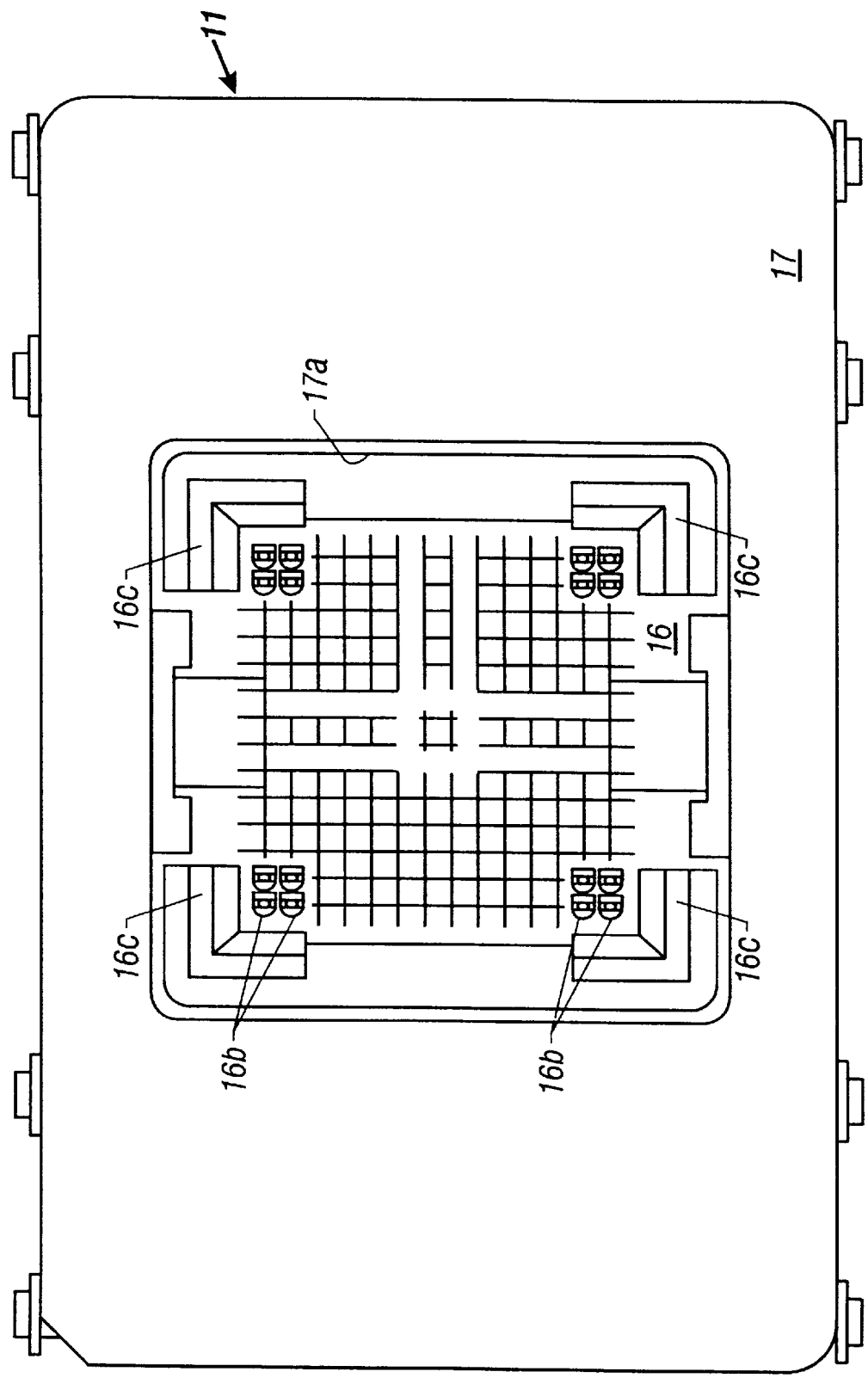
FIG. 2 is a plan view of the IC socket according to the mode 1 of FIG. 1.

Furthermore, the upper operation member 17 has a rectangular frame structure, as shown in FIG. 2, having an opening 17a of a size capable of being inserted with the IC package 12, and the IC package 12 is mounted on the upper plate 14 by the insertion of the IC package through the opening 17a. The upper operation member 17 is disposed to the socket body 13 to be vertically movable through a slide portion 17b, and as shown in FIG. 4, the upper operation member 17 is urged upward by a spring 20 disposed between the upper operation member 17 and the socket body 13.

Still furthermore, in this embodiment, the X-shaped links 18 are disposed at four portions, corresponding to the respective both end portions of both the side portions of the rectangular body normal to the moving direction of the movable member 14, thus constituting a toggle joint.

Figure 6:
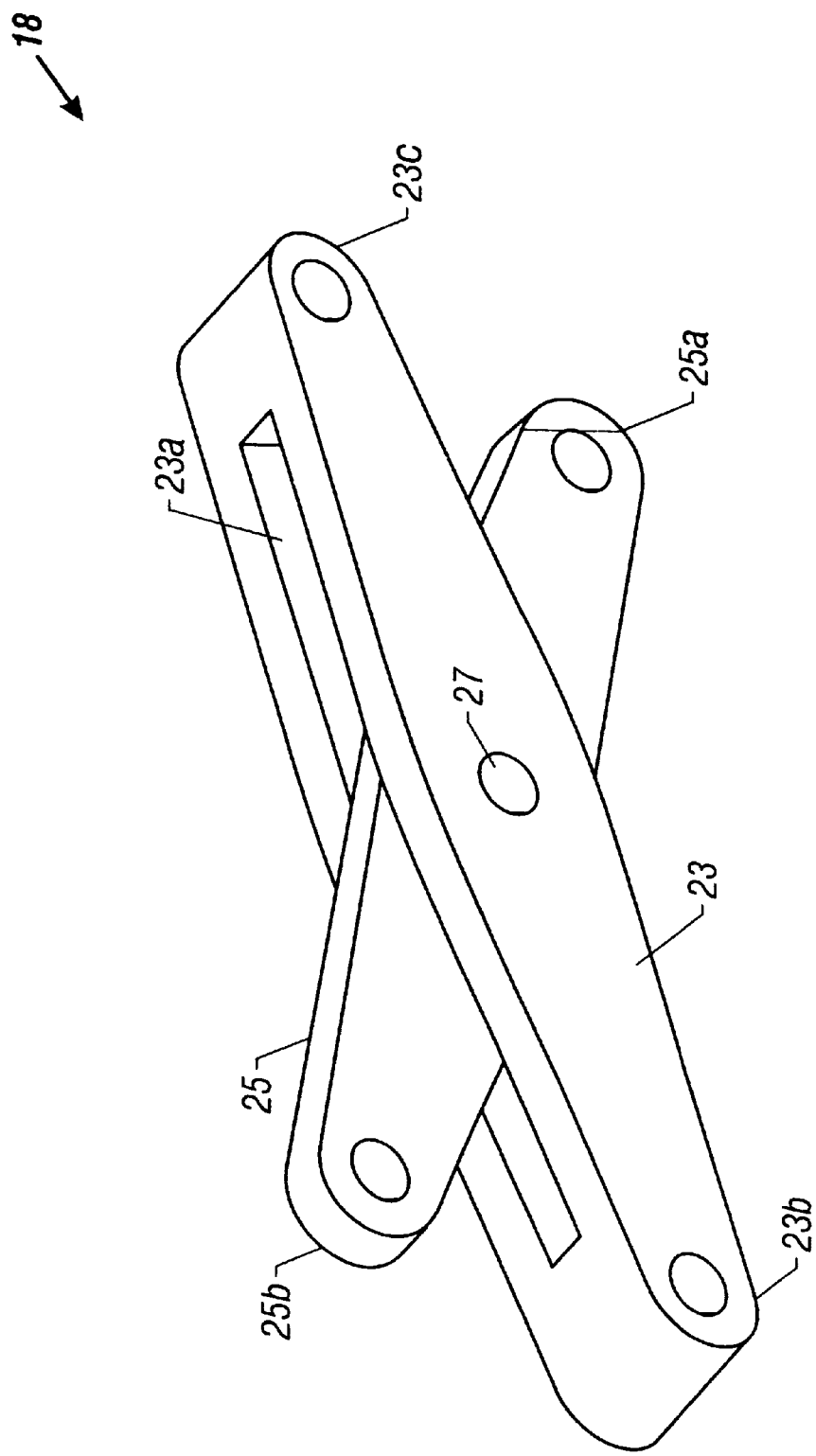
FIG. 6 is a perspective view showing first and second links of the mode 1.

More concretely, the X-shaped link 18 is composed of first and second link members 23 and 25 having the same length, and as shown in FIG. 6, it is preferred that the first link member 23 is formed with a slit 23a, into which the second link member 25 having a flat plate shape is inserted, and the second link member 25 is connected to be pivotal by means of a central coupling pin 27.

The first link member 23 has a lower end portion 23b which is connected to the socket body 13 by means of a lower end coupling pin 29 to be pivotal thereabout, and the second link member 25 has a lower end portion 25a to one end of the side portion of the movable member 14 along the moving direction thereof by means of a lower end connection pin 30 to be pivotal thereabout. These first and second link members 23 and 25 also have upper end portions 23c and 25b which are connected to the upper operation member 17 by means of upper end connection pins 33 and 34 to be pivotal thereabout, respectively. The upper end connection pin 33 disposed to the upper end portion 23c of the first link member 23 is inserted, to be movable in the horizontal direction, into a slot 17c formed to the upper operation member 17 so as to elongate in the horizontal direction.

As shown in FIGS. 4 through 8, a latch 35 is disposed to the socket body 13 to be rotatable about a shaft 35a of the lower end portion of the latch so as to be engaged with or disengaged from the side edge portion of the IC package 12 set to a predetermined portion, the latch 35 being urged in the engaging direction. The upper operation member 17 is formed with a cam portion 17d for rotating the latch 35 through the sliding motion thereof in the disengaging direction when the upper operation member 17 is lowered.

In FIG. 3, reference numeral 38 denotes a locator board performing the positioning function at the time of mounting to the print wiring board.

The IC socket 11 of the structure mentioned above will be used in the following manner.

First, the lead portions 19a of the contact pins 19 of the IC sockets 11 are preliminarily inserted through the insertion holes of the print wiring board and then soldered to thereby locate a plurality of IC sockets 11 on the print wiring board.

The IC package 12 is set in the following manner so as to electrically connect to such IC sockets 11 by an automatic machine, for example.

Figure 8A:
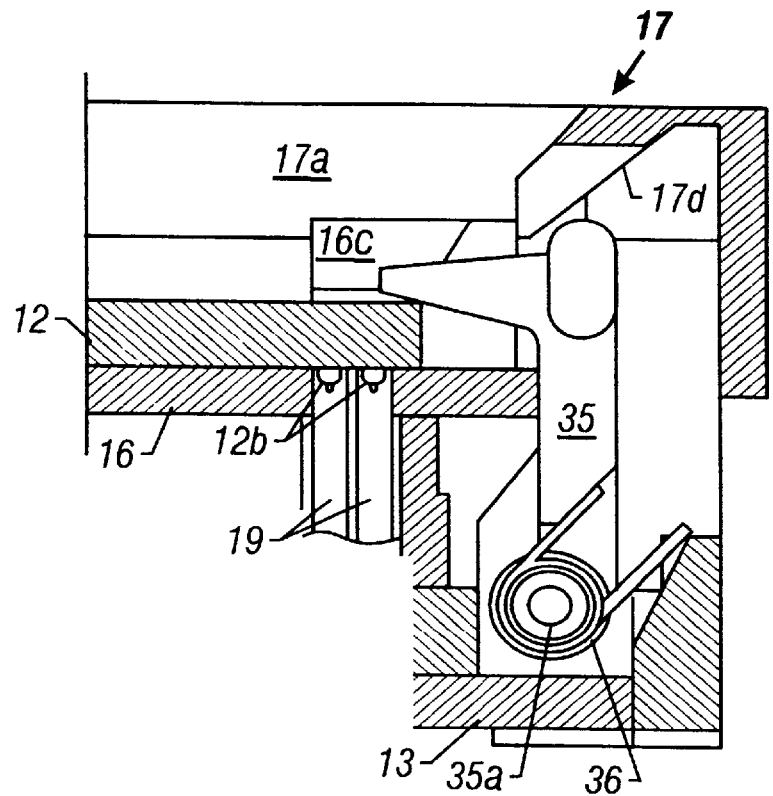
FIGS. 8a and, 8b are views showing a latch and so on according to the mode 1, in which (a) shows a state of holding the IC socket and (b) shows a state of releasing the IC socket.
Figure 8B:
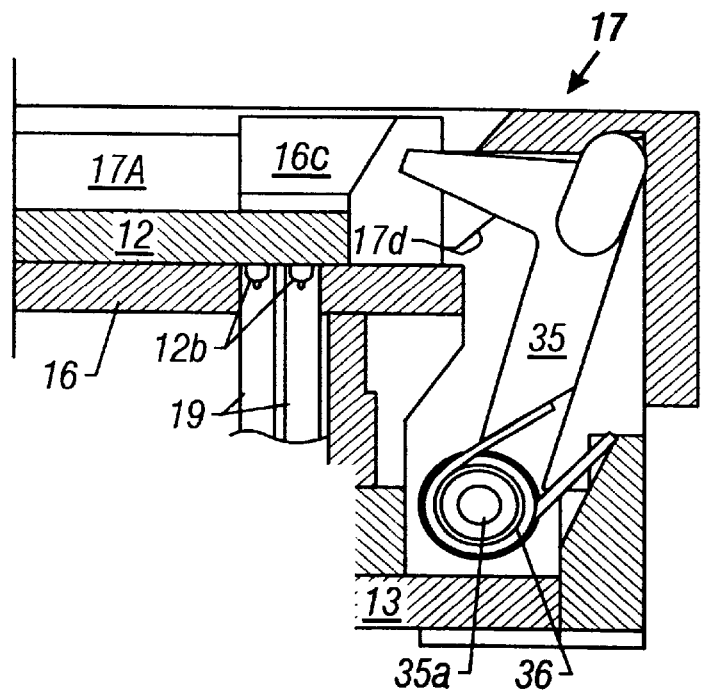

That is, the upper operation member 17 is depressed downward to lower the same against the urging force of the spring 20 with the IC package being held by the automatic machine. Then, as shown in FIG. 8(b), the latch 35 is rotated against the urging force of a spring 36 because of the location of the cam portion 17d to thereby retire the latch 35 from the insertion range of the IC package 12. At the same time, the movable plate 14 is horizontally moved through the X-shaped link 18, and according to this horizontal movement of the movable member 14, the contact pins 19 are pressed by the pressing portion 14a of the movable plate 14 and hence elastically deformed and then displaced (see FIG. 5(b)). Under this state, the spherical terminal 12b of the IC package 12, which has been held, is inserted into the through hole 16b of the upper plate 16 and the IC package 12 is then released.

Thereafter, when the pressing force to the upper operation member 17 by the automatic machine is released, the upper operation member 17 is raised by the urging force of the spring 20 and the movable plate 14 is returned to its original position. According to such motion, the contact pins 19 are returned by their elasticity and the upper end portions 19b of the contact pins 19 contact the spherical terminals 12b of the IC package 12, thus establishing the electrical connection therebetween. At the same time, through the upward movement of the upper operation member 17, the latch 35 is rotated in a direction reverse to the arrowed direction in FIG. 4 by the urging force of the spring 36 and the latch 35 is engaged with the side portion of the IC package 12, which is thereby held (see FIG. 8(a)).

The operation of the X-shaped link 18 for horizontally moving the movable plate 14 will be explained hereunder.

Figure 1B:
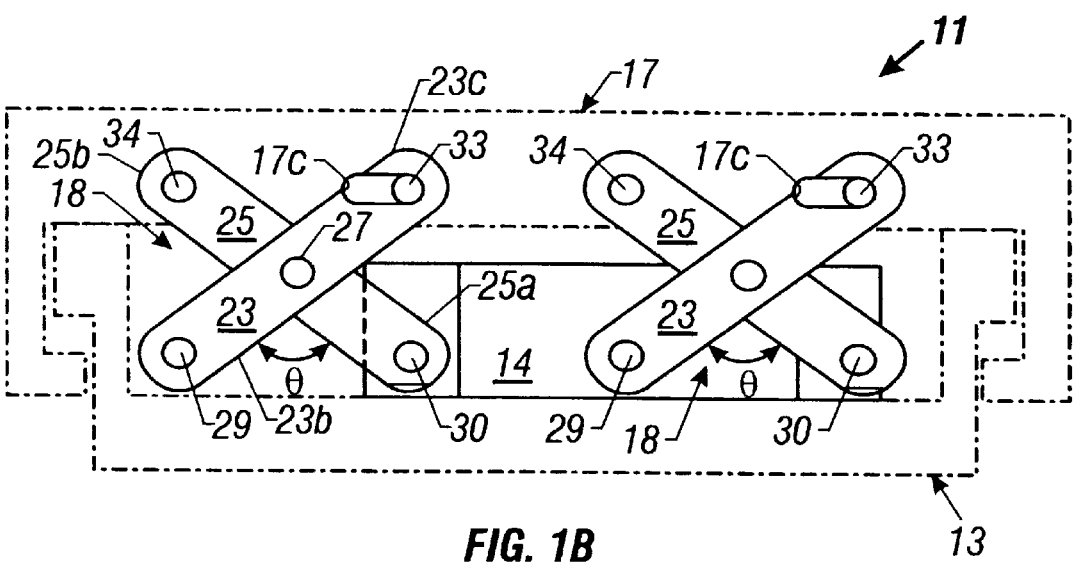

When the upper operation member 17 is lowered, the upper end portions 23c and 25b of the first and second link members 23 and 25 are depressed downward and then lowered from the state shown in FIG. 1(a) to the state shown in FIG. 1(b), whereby the link members 23 and 25 are then rotated and the lower end portion 25a of the second link member 25 is moved in the horizontal direction (arrowed direction), thereby moving the movable plate 14 in the arrowed horizontal direction.

In such operation, according to the increasing of the depressed amount of the upper operation member 17, the reaction force of the contact pin 19 is increased. In such case, it is required for the lever utilizing the principle of lever as in the prior art to have a large depressing force according to the increased depressing force amount of the operation member 17, thus providing no good maneuverbility. However, according to the present invention, the X-shaped link 18 constitutes the toggle joint and the toggle joint presses the movable plate 14 with a force increasing as an angle $f\!\!\not\!E$ constituted by the first and second link members 23 and 25 in FIG. 1 increases, i.e., as the depressing force of the upper operation member 17 increases. Accordingly, even if the depressed amount of the upper operation member 17 would be increased, the movable plate 14 can be moved horizontally without increasing the depressing force, thus providing an improved maneuverbility.

Furthermore, the X-shaped link 18 constitutes a toggle joint and the direction of the vertical motion of the upper operation member 17 is converted into the direction of the bilateral motion of the lower end coupling pin 30, so that the movable plate 14 of the present invention can be accurately moved in the horizontal direction in comparison with the conventional art in which the movable plate 4 is horizontally moved by the coupling pins 2b and 3b carrying out the circular motion.

Still furthermore, two pairs of X-shaped links 18 are disposed on both the side surface portions along the horizontally moving direction of the movable plate 14, that is, four links 18 are disposed, and the lower end portions 25a of the second link members 25 are secured respectively to both the end portions of the side surface portions in the horizontal direction thereof, whereby the forces from these lower end portions 25a are applied to the movable plate 14. Therefore, the force is dispersed, in comparison with the case of the force concentrated on one portion, towards the leading and trailing end sides of the movable plate 14 in the advancing direction thereof, thus stably moving the movable plate 14 in the horizontal direction.

Still furthermore, in the preferred state, the second link member 25 is inserted into the slit 23a of the first link member 23 and connected thereto by means of the central connection pin 27, so that when the force is transmitted between the first and second link members 23 and 25 through the central connection pin 27, the force acting on the central connection pin 27 is dispersed to two portions on both the sides of the second link member 25 and the shearing force acting on the connection pin 27 is also dispersed, and in this instance, no bending moment is applied to one of the link members 23 and 25 by way of the central coupling pin 27 and the force can be transmitted in a balanced condition.

Still furthermore, the positioning bosses 13a formed to the socket body 13 are inserted into the idle insertion portions 14c of the movable plate 14 and fitted to the recesses 16a of the upper plate 16 to thereby support the same, and the size of the idle insertion portion 14c is set so as to allow the movable plate 14 to be horizontally movable without being interfered with the positioning bosses 13a. Therefore, it is not necessary to form any member for supporting the upper plate 16 at an outside portion of the socket body 13 to the movable plate 14, thus making compact the structure of the IC socket 11. The idle insertion portion 14c may be formed in a hole shape or a groove shape opened to side surface side.

Figure 9C:
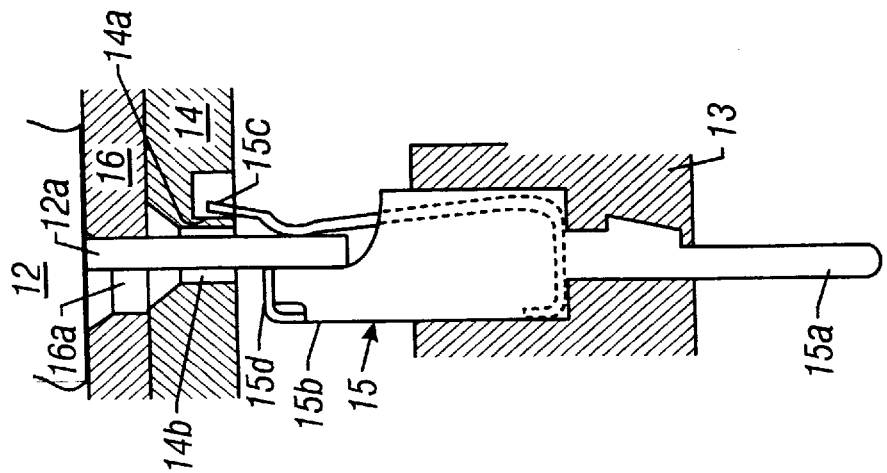
FIGS. 9a through 9c are sectional views, similar to FIG. 5, representing a modification of the mode 1 showing the relationship between the movable member, the contact pins and their associated members.
Figure 9B:
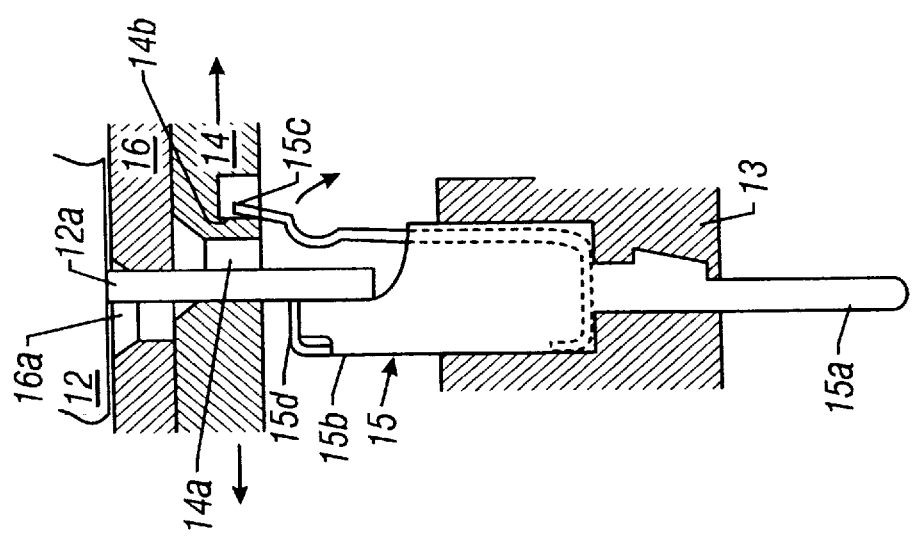
Figure 9A:
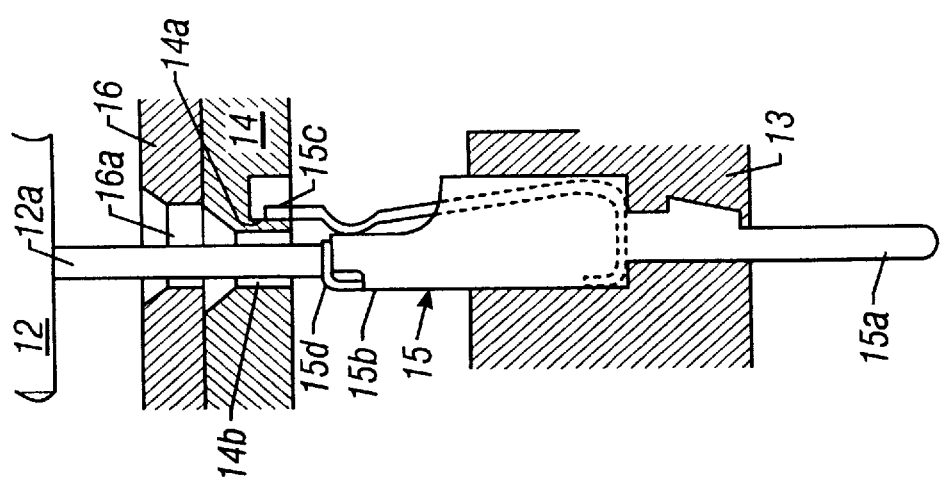

The contact pin 19 mentioned above is used as a member for performing the electrical conduction to the spherical terminal of the IC package 12, but the present invention is not limited to such contact pin 19 and a contact pin 15 performing the electrical conduction to a rod-shaped terminal 12a of the IC package 12, as shown in FIG. 9, may be utilized. That is, the contact pin 15 is press fitted into the socket body 13, has a lead portion 15a projecting downward from the lower surface of the socket body 13 and also has an upper portion, projecting upward from the upper surface of the socket body 13, to which stationary terminal portion 15b and movable terminal portion 15c are formed. The stationary terminal portion 15b is formed with a horizontal surface portion 15d against which the rod-shaped terminal 12a of the IC package 12 abuts as shown in FIG. 9(a). Further, the movable terminal portion 15c is engaged with the pressing portion 14a of the movable plate 14 and elastically deformed and displaced by the movement of the movable member 14 in the arrowed horizontal direction, and the gap between the movable terminal portion 15c and the stationary terminal portion 15b is opened as shown in FIG. 9(b). Therefore, the rod-shaped terminal 12a of the IC package 12 inserted through the through hole 16a of the upper plate 16 and the insertion portion 14b of the movable plate 14 is inserted into the gap between the stationary terminal portion 15b and the movable terminal portion 15c. As shown in FIG. 9(c), the rod like terminal 12a of the IC package 12 is clamped between the stationary terminal portion 12b and the movable terminal portion 12c of the contact pin 15, thus establishing an electrical conduction therebetween.

Furthermore, although, in this embodiment, the X-shaped links 18 are disposed at four portions corresponding to the four corner portions of the movable plate 14, the present invention is not limited to this arrangement and the X-shaped links 18 may be disposed at three or more portions corresponding to the one side surface portion of the movable plate 14 in a case where the connector itself has a large scale.

[Mode 2 for Embodying The Invention]

Figure 10A:
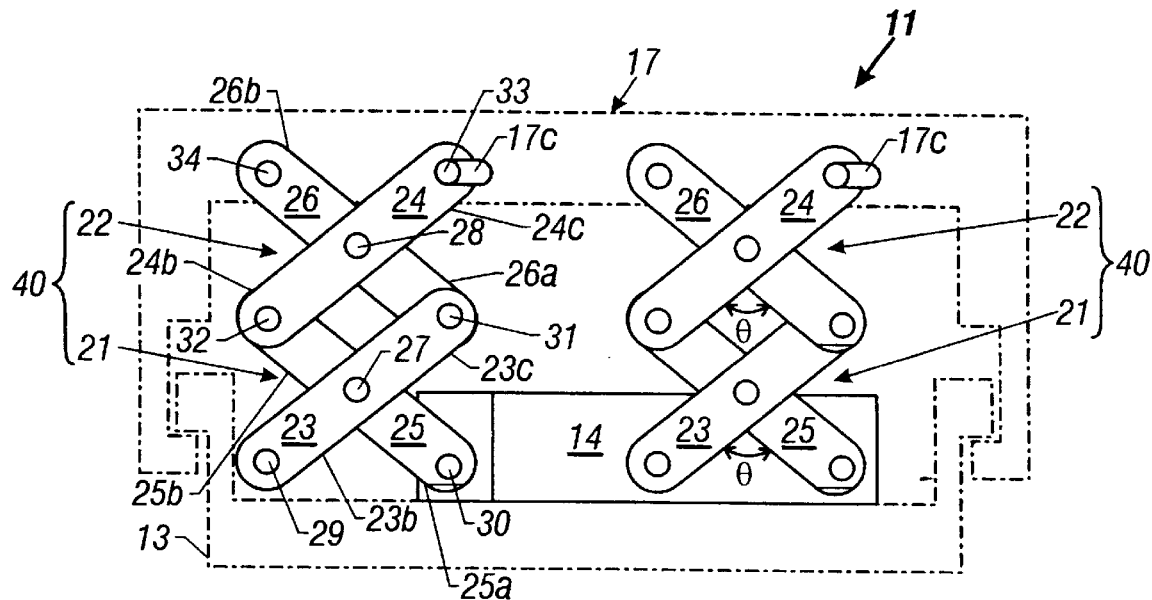
FIGS. 10a and 10b are schematic views showing a link mechanism of an IC socket according to a mode 2 of the present invention.
Figure 10B:
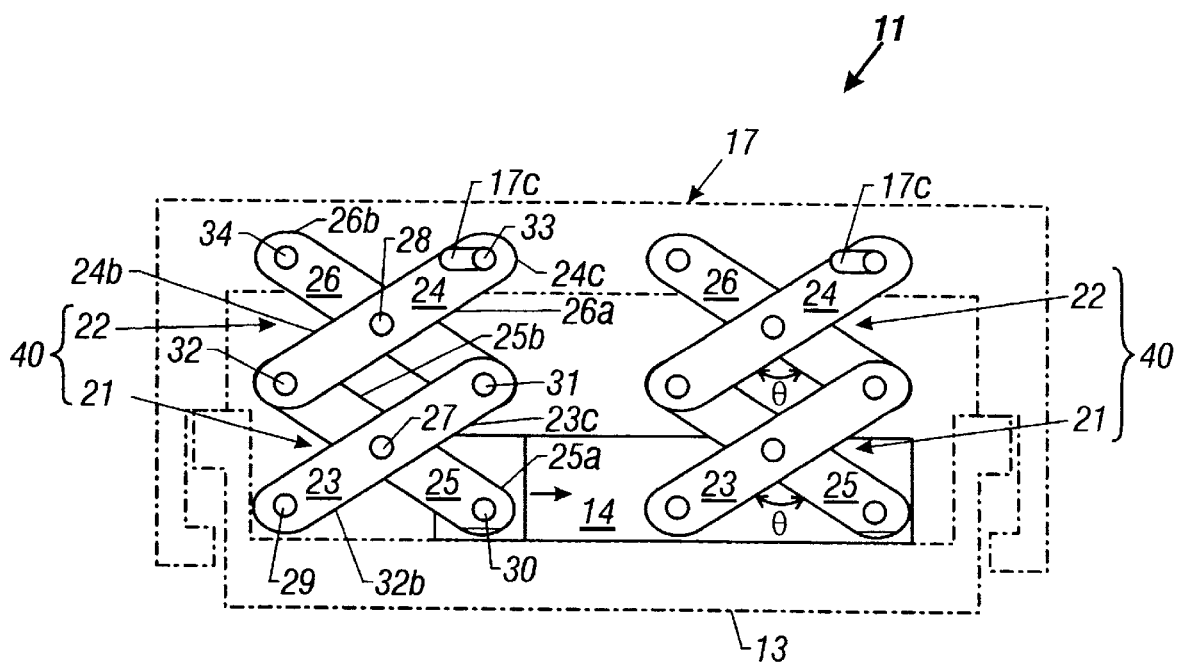
Figure 11:
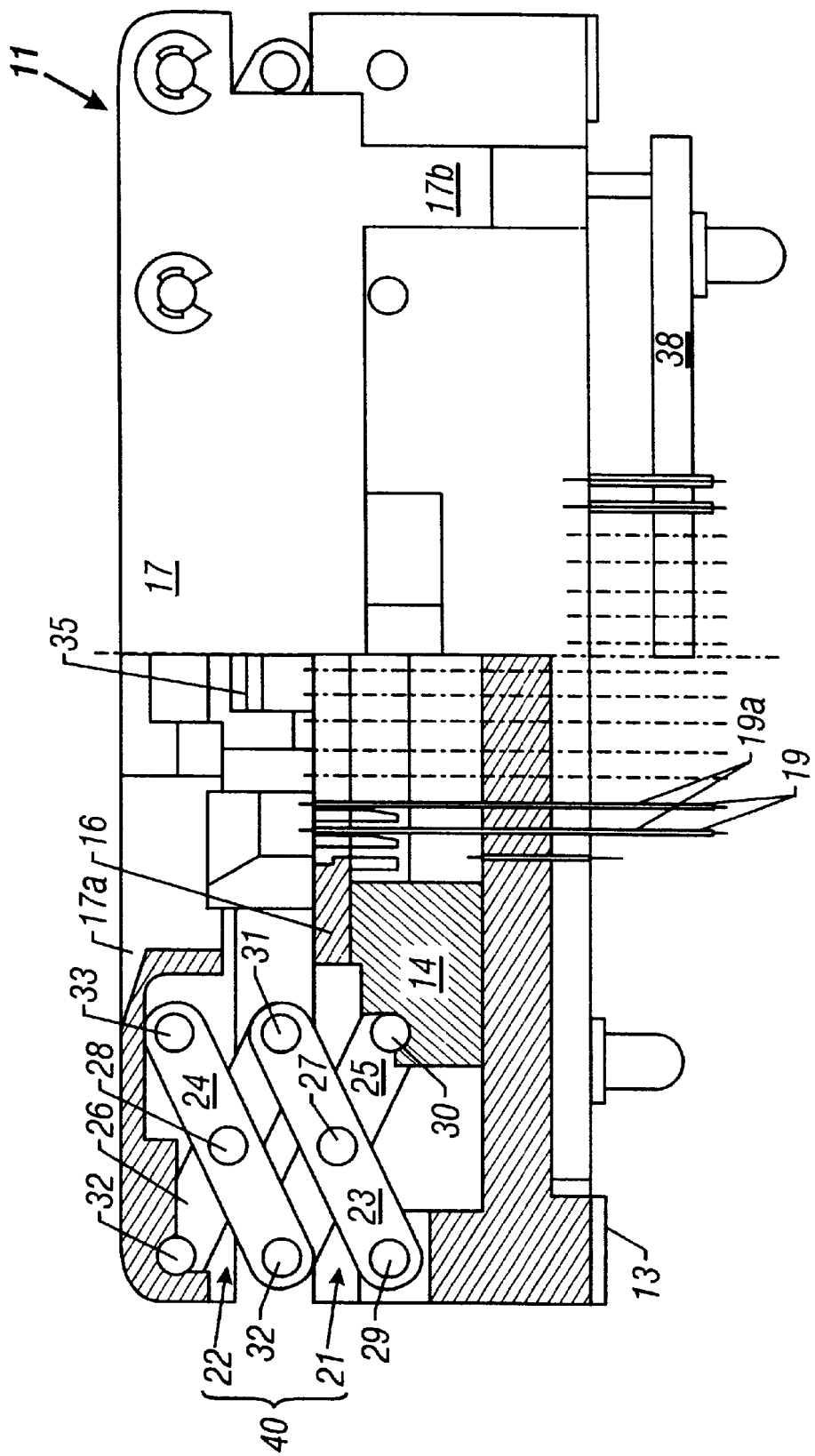
FIG. 11 is a front view of the IC socket of the mode 2 of the present invention.
Figure 12:
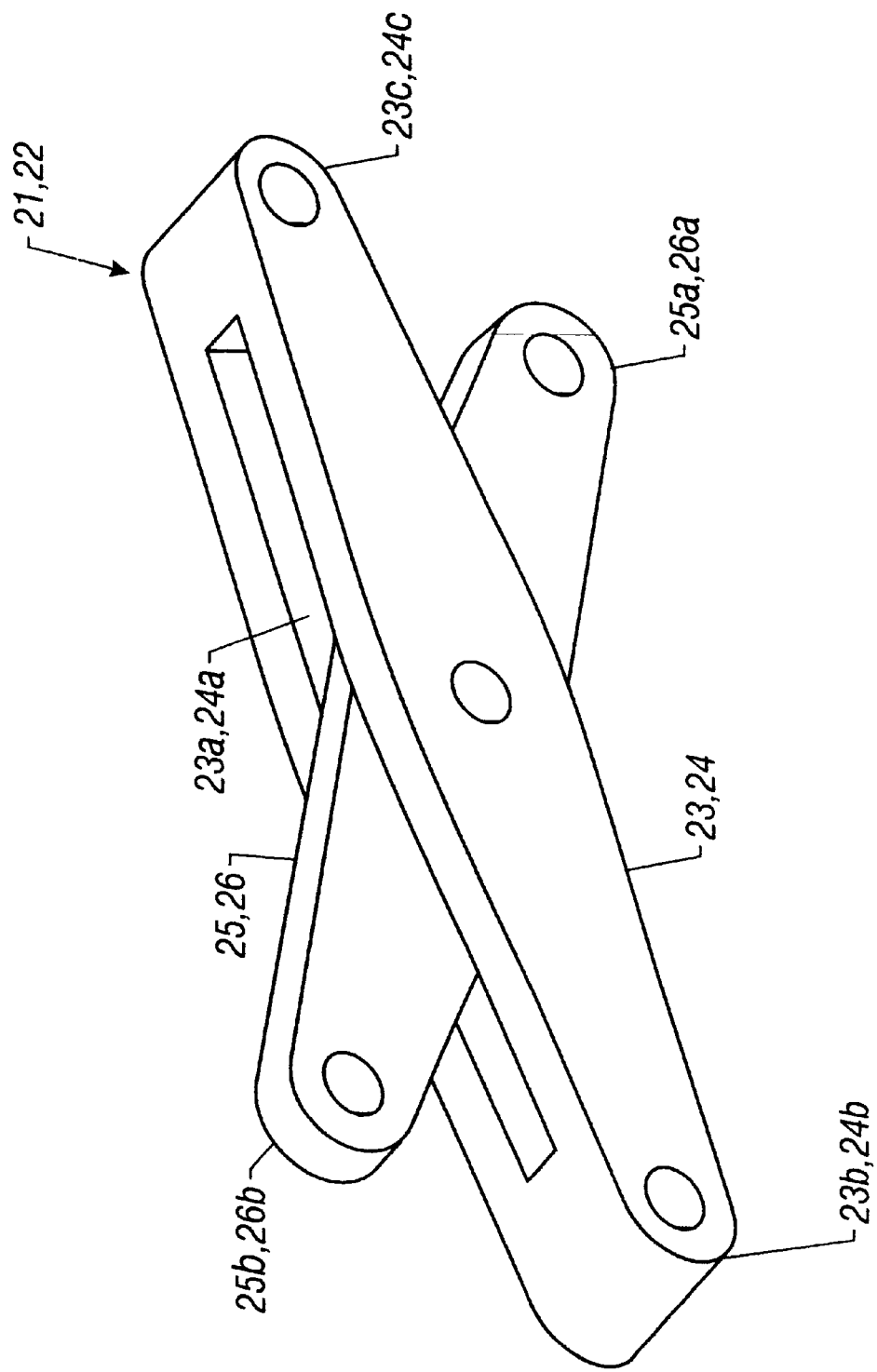
FIG. 12 is a perspective view of first and second links according to the mode 2.

FIGS. 10 to 12 represent a mode 2 (second embodiment) of the present invention.

This second embodiment differs from the first embodiment in that a link mechanism 40 is disposed in place of the X-shaped link 18 of the first embodiment.

That is, in this embodiment, four link mechanisms 40 are disposed at portions corresponding to both end portions in the moving direction of both the side surface portions along the horizontally moving direction of the rectangular movable plate 14 and each composed of a lower side X-shaped link 21 as "lowermost stage X-shaped link" and an upper side X-shaped link 22 as "uppermost X-shaped link", which are disposed vertically in two stages and connected together, constituting a toggle joint.

The lower side X-shaped link 21 and the upper side X-shaped link 22 are each composed of a first link member 23 (24) and a second link member 25 (26), having the same length, and as shown in FIG. 12, the first link members 23 and 24 are formed with slits 23a and 24a, into which the second link members 25 and 26 of flat-plate shape are inserted and these link members are pivotally connected together by means of central coupling pins 27 and 28.

The lower end portion 23b of the first link member 23 of the lower side X-shaped link 21 is pivotally connected to the socket body 13 through a lower end coupling pin 29, and the lower end portion 25a of the second link member 25 is also pivotally connected by means of a lower end coupling pin 30 to one end portion of the side surface portion of the movable plate 14 along the horizontally moving direction thereof.

The upper end portion 23c of the first link member 23 of the lower side X-shaped link 21 is pivotally connected to the lower end portion 26a of the second link member 26 of the upper side X-shaped link 22 by means of an intermediate coupling pin 31, and the upper end portion 25b of the second link member 25 of the lower side X-shaped link 21 is pivotally connected to the lower end portion 24b of the first link member 24 of the upper side X-shaped link 22 by means of intermediate coupling pin 32. Furthermore, upper end portions 24c and 26b of the first and second link members 24 and 26 of the upper side X-shaped link 22 are pivotally connected to the upper operation member 17 through upper end coupling pins 33 and 34, respectively. The upper end coupling pin 33 provided for the upper end portion 24c of the first link member 24 is inserted into a long hole 17c, to be movable in the horizontal direction, formed to the upper operation member 17 so as to extend in the horizontal direction.

An operation of a link mechanism 40 for horizontally moving the movable plate 14 will be described hereunder.

When the upper operation member 17 is lowered, the upper end portions 24c and 26b of both the link members 24 and 26 of the upper X-shaped link 22 is pressed downward and then lowered from the state shown in FIG. 10(a) to the state shown in FIG. 10(b), whereby the lower end portion 25a of the second link member 25 of the lower X-shaped link 21 is moved in the horizontal (arrowed) direction through the upper and lower X-shaped links 22 and 21, thus moving the movable plate 14 in the arrowed horizontal direction.

In the structure mentioned above, as the depressing amount of the upper operation member 17 increases, the reaction force of the contact pin 19 increases. In such operation, in the prior art in which the lever utilizing the principle of lever requires large depressing force according to the increased depressing force amount of the upper operation member 17, thus providing no good maneuverbility. However, according to the present invention, the link mechanism 40 constitutes a toggle joint and the toggle joint presses the movable plate 14 with an increasing force as an angle $f Æ$ constituted by the first link members 23, 24 and the second link members 25, 26 as in FIG. 1 increases, i.e., as the depressing force of the upper operation member 17 increases. Accordingly, even if the depressed amount of the upper operation member 17 be increased, the movable plate 14 can be moved horizontally without increasing the depressing force, thus providing an improved maneuverbility.

Furthermore, the link mechanism 40 may be provided with plural stages such as upper and lower two stages of X-shaped links 21 and 22 in this embodiment, and in such arrangement, the operating force can be reduced one half in comparison with the location of only one stage. Moreover, since these stages can be arranged in vertically piled arrangement, the operating force can be reduced without taking distance in the bilateral direction, and accordingly, such arrangement is particularly effective in a case where less space exists in the bilateral direction and light operating force is required.

Still furthermore, in a case where it is required to make large the vertical motion amount of the upper operation member 17 without changing the horizontal motion amount of the movable plate 14, these requirements can be go achieved by locating the X-shaped links in plural stages even in a case of limited bilateral location space without making long the length of the lever as in the prior art. In a case where the automatic machine or peripheral equipments have different sizes or attain different functions and, hence, slight errors in the vertical movement of the upper operation member are caused, the occurrence of the operational defects can be suppressed by making large the vertical motion of the upper operation member without largely affecting on the horizontally moving of the movable plate 14.

As mentioned above, even in a case where the location space is limited, the depressing force is made small and the vertical motion amount of the upper operation member can be made large without changing the horizontally moving amount of the movable plate 14, thus improving the degree of design freedom.

Furthermore, since two pairs of link mechanisms are disposed each on both the side surface portions normal to the moving direction of the movable plate 14 and the lower end portions 25*b* of the second link members 25 of the lower X-shaped links 21 are secured to both end portions of these side surface portions, the forces through the lower end portions 25*b* act on the movable plate 14. Accordingly, the force is dispersed in comparison with a case where the force is concentrated on one portion toward the leading end Inside and the trailing end side in the advancing direction, Hand therefore, the movable plate 14 can be stably moved horizontally.

Still furthermore, in the preferred embodiment, the first and second link members 23, 24, 25 and 26 of the respective X-shaped links 21 and 22 have arrangement such that the second link members 25 and 26 are inserted into the slits 23*a* and 24*a* of the first link members 23 and 24 and both links are connected through the central coupling pins 27 and 28, respectively, so that when the force is transmitted between the first link members 23, 24 and the second link members 25, 26 through the central coupling pins 27, 28, the force acting on the central coupling pins 27, 28 is dispersed to two portions of both sides of the second links 25, 26 to thereby disperse the shearing force acting on the central coupling pins 27, 28, and at this time, the force can be surely transmitted in a balanced state without causing a bending moment to the link members 23—through the central coupling pins 27, 28.

The structure of the second embodiment other than the above is substantially the same as that of the first embodiment, so that the details thereof are omitted herein.

[Mode 3 for Embodying The Invention]

Figure 13:
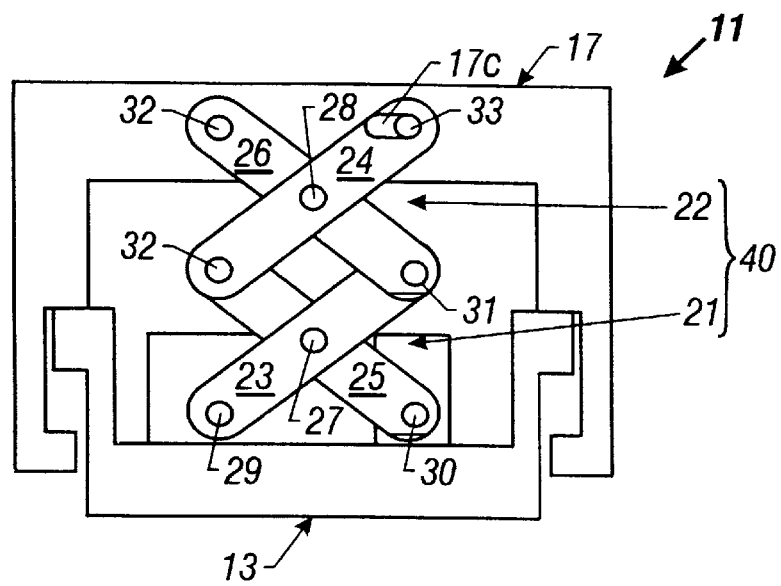
FIG. 13 is a schematic view, similar to FIG. 10(b), representing the mode 2.

FIG. 13 represents the mode 3 (third embodiment) of the present invention.

Although, in the second embodiment, a pair of link mechanisms 40 are disposed on each of both the side portions of the movable plate 14, totally four link mechanisms, in this third embodiment, one link mechanism is disposed on each of both the side portions thereof, totally two link mechanisms.

The link mechanism 40 of this embodiment is composed of a lower X-shaped link 21 and an upper X-shaped link 22 as in the second embodiment.

The other structures are substantially the same as those of the second embodiment.

Further, although, in the above respective embodiments, the present invention is applied to the IC socket 11, the present invention is not limited to this use and is applicable to other devices which achieve electrical connection. Furthermore, although the link mechanism 40 in the respective embodiments is provided with the X-shaped links 21 and 22 in vertical upper and lower stages, the present invention is not limited to this arrangement and more than two links may be disposed in consideration of the moving amount of the movable plate 14, the vertical motion amount and the depressing force of the upper operation member 17, the location space of the link mechanism 40. Still furthermore, the numbers of the link mechanisms 40 may be freely set, though not limited in the above embodiments. Further, the link mechanisms 40 may be disposed as in the above embodiments in correspondence to the body side surface portions in parallel to the moving direction of the movable member 14.

[Mode 4 for Embodying The Invention]

Figure 14:
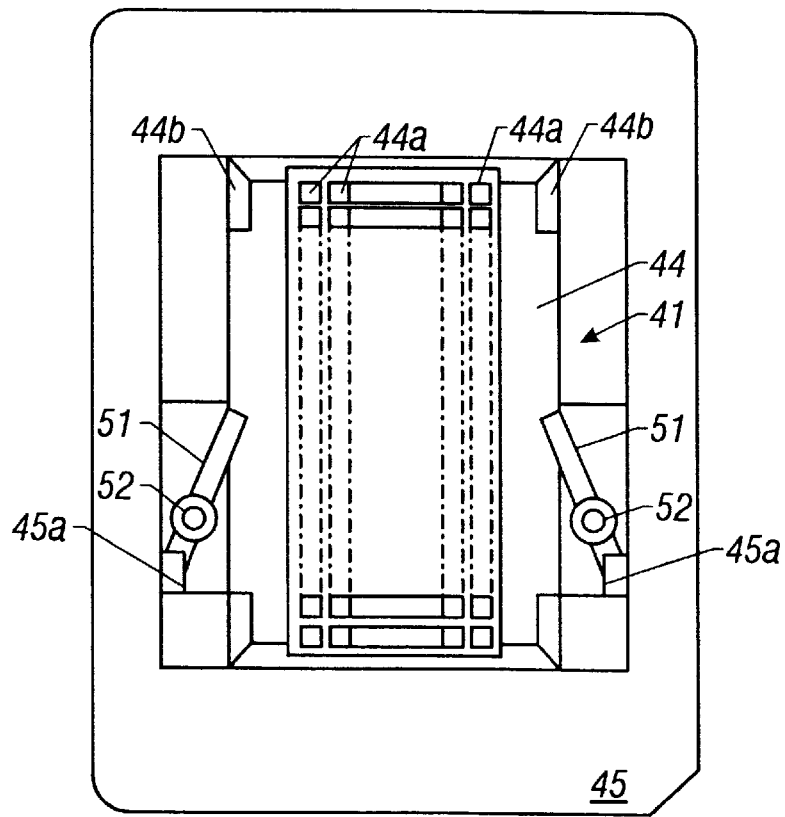
FIG. 14 is a plan view of an IC socket.
Figure 15:
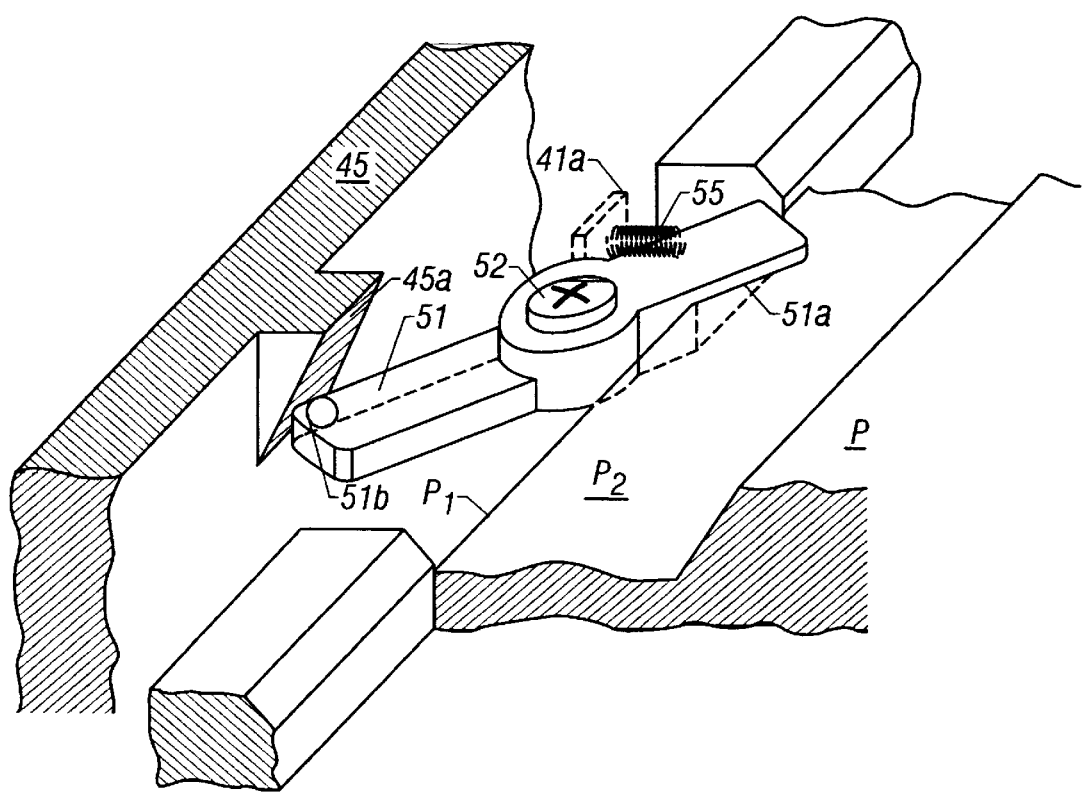
FIG. 15 is an enlarged view showing an important portion in FIG. 14.
Figure 16:
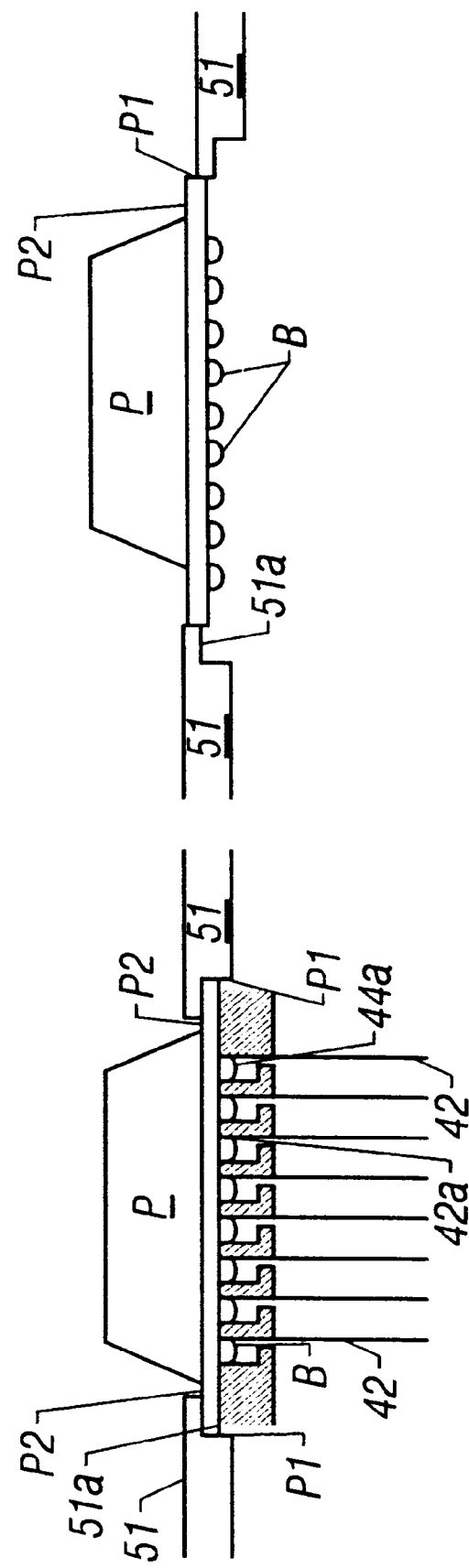
FIG. 16 is a view showing an operation of a clever, in which (a) shows a state in which the IC package is correctly mounted and (b) shows a state in which the IC package is incorrectly mounted.

FIGS. 14 to 16 represent a mode 4 (fourth embodiment) of the present invention.

In this fourth embodiment, the X-shaped links, not shown, are disposed as in the above respective embodiments, but in this embodiment, a lever 51 is attached to be rotatable, which fact is different from the foregoing embodiments.

That is, reference numeral 41 denotes a socket body designed to be usable for an IC package P of BGA type as an "electrical part" and reference numeral 42 denotes a plurality of contacts pins arranged in rows to the socket body 41 in a manner such that the base portions of the contact pins are press fitted into a number of aligned holes perforated to the bottom wall of the socket body as "connector body". Reference numeral 44 denotes an upper plate on which the IC package P is mounted integrally formed to the socket body 41 but not integrally therewith at an upper portion of the movable plate 14, which is not shown, and a number of holes 44*a* capable of receiving respective ball terminals B of the IC package P and contacting portions 42*a* of the respective contact pins 42 are formed to be fittable in the holes 44*a*. Furthermore, reference numeral 45 denotes upper operation members, each having a frame structure, disposed to be vertically movable at the upper portion of the socket body 41 and provided with cams 45*a*, mentioned hereinafter, to opposing pair of inner side surfaces.

The vertical movement in a perpendicular direction of the upper operation member 45 is limited by an elevating motion limiting means, not shown, such that the upper operation member 45 merely moves upward to a predetermined position and is urged upward by a coil spring, not shown, disposed between it and the socket body 41.

The lever 51 is mounted to the socket body 41 at the inside portion of the upper operation member 45 to be pivotal through a shaft 52. The lever 51 has one end portion to which a stepped portion 51*a* engageable with a side surface P1 and a side upper surface P2 of the IC package P is formed and has another end portion to which a spherical projection abutting against the cam 45*a* of the upper operation member 45 is formed.

The lever 51 shown on the left side in FIG. 14 is urged in a clockwise direction by urging means and the lever shown on the right side in FIG. 14 is urged in a counterclockwise direction by urging means. Such urging means is composed, as shown in FIG. 15, of a stopper piece 41*a* formed to the socket body 41 in a standing manner and a coil spring 55 disposed between the stopper piece 41*a* and the outer side surface of the one end portion of the lever 51. It is to be noted that the present invention is not limited to this structure and it may be possible to use a twist spring to urge the lever 51 in a predetermined direction, or a plate spring may be also used.

Further, a guide frame 44*b* for guiding the IC package P to a predetermined position is provided for the upper plate 44.

According to the structure mentioned above, in the state that the upper operation member 45 is not depressed, the upper operation member 45 is pushed upward as shown by the restoring forces of the coil spring and the contact pins 42. The lever 51 is positioned at a portion at which one end of the lever 51 advances inside the upper plate 44, and the contacting portion 42a of the contact pin 42 is positioned at a portion facing inside the hole 44a.

Under the state mentioned above, when the upper operation member 45 is depressed, the movable plate is moved through the X-shaped link, though not shown, and the contacting portions 42a are displaced so as to be retired all at once from the holes 44a of the upper plate 44 against the elastic force of the contact pins 42.

In this instance, the cam portion 45a of the upper operation member 45 rotates the lever 51 through the spherical projection 51b and operates to retire the stepped portion 51a outside the guide frame 44b of the upper plate 44. Under the state, the IC package P is inserted from the upper side and rested on the upper plate 44 while being guided by the guide frame 44b.

Then, when the pressing force to the upper operation member 45 is released, the upper operation member 45 is returned to the upper limit position mainly by the restoring force of the coil spring and the elastic force of the respective contact pins 42 act to return the upper operation member 45 to the original position of the movement thereof. In accordance with this upward movement of the upper operation member 45, the lever 51 is rotated so that the stepped portion 51a is advanced into the guide frame 44b of the upper plate 44 by means of the coil spring 55. Therefore, if the IC package P is rested to the correct position on the upper plate 44, the ball terminals B of the IC package P is advanced into the corresponding holes 44a, respectively, as shown in FIG. 16(a) and contact the contacting portions 42a of the contact pins 42, which are now in condition of returning to the original position, by the predetermined contacting pressure, and the stepped portion 51a of the lever 51 is engaged with the side surface P1 and the side upper surface P2 of the IC package P, serving to maintain the correct position of the IC package P.

However, in a case where the IC package P is not correctly placed on a prescribed position of the upper plate 44 by any reason, as shown in FIG. 16(b), the end portion of the lever 51 abuts against the side surface P1 of the IC package P and the lever 51 is not then rotated from its state and takes its locking position. Accordingly, this incorrect location can be surely externally observed from the outside position and an incorrect positioning of the IC package P can be known. As mentioned above, the lever 51 may act as detection means for detecting whether the IC package P can be surely located in position or not.

In this embodiment, it is to be noted that although the present invention is applied to the BGA type IC package, it is of course applicable to any other type one.

[Mode 5 for Embodying The Invention]

Figure 17:
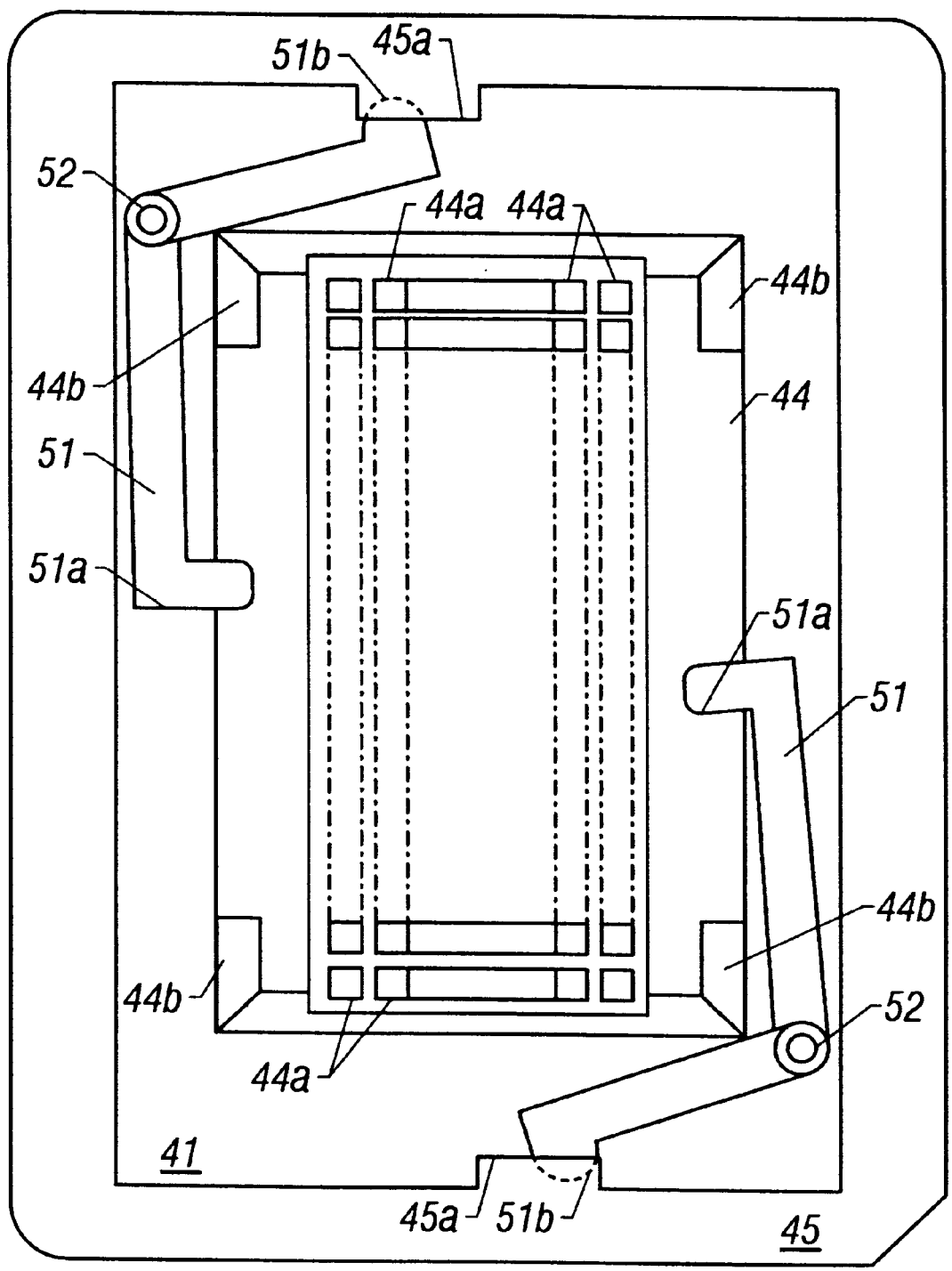
FIG. 17 is a plan view showing another example of the IC package.
Figure 18:
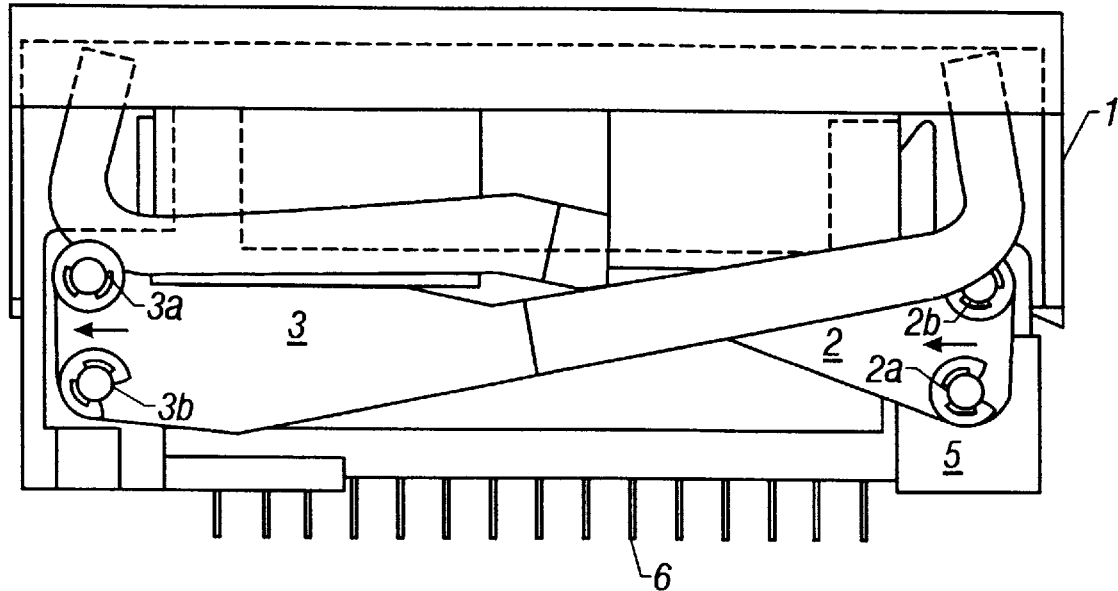
FIG. 18 is a front view showing a conventional example.
Figure 19:
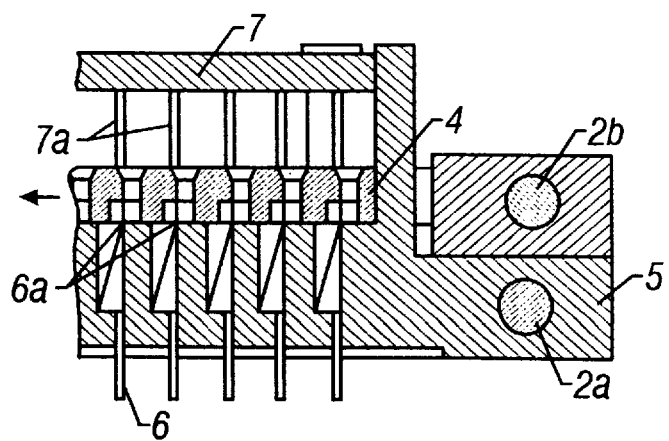
FIG. 19 is a sectional view of the example of FIG. 18.

FIG. 17 represents the mode 5 (fifth embodiment) of the present invention.

The fifth embodiment differs from the fourth embodiment in the structures of the lever 51 and so on.

That is, each of the levers 51 in this embodiment provides substantially an L-shape structure, and the levers 51 are disposed to be pivotal about pivots 52 disposed at the corner portions of the socket body 41. These levers 51 are disposed at left upper corner portion and right lower corner portion of the socket body 41 as shown in FIG. 17 and are urged in a counterclockwise direction by spring means, not shown. Furthermore, the upper operation member 45 is formed with a cam portion 45a rendering the lever 51 to rotate in the clockwise direction against the urging force of the spring means, when the upper operation member 45 is lowered, by depressing the spherical projection 51b formed to one end portion of the lever 51.

According to such structure, when the upper operation member 45 is depressed downward, the spherical projection 51b is pressed by the cam portion 45a, so that the lever 51 is rotated in the clockwise direction in FIG. 17 against the pressing force of the cam and the stepped portion 51a of the lever 51 is retired outward from the IC package mounting range.

Accordingly, under this state, the IC package P can be placed on the correct position of the upper plate 44. Therefore, when the depressing force to the upper operation member 45 is released, the upper operation member 45 is raised upward by the restoring force of the coil spring, and at the same time, the contact pin 42 returns by its elastic force and contacts the spherical terminal B. Further, the levers 51 are rotated by the urging means respectively in the clockwise direction to the positions shown in FIG. 17.

Accordingly, in the case where the IC package P is mounted to its correct position, the stepped portion 51a is engaged with the side surface and side upper surface of the IC package P, thus holding its correct position of the IC package P as it is. Further, in the case where the IC package P is not mounted to its correct position by any reason, as like in the former embodiment, the lever 51 takes its lock state during the rotation thereof, thus showing that the IC package P is not placed to its correct position. Furthermore, the lever 51 takes its original position by the urging force at a time when it is not pressed by the upper operation member 45 through the urging force thereof, and in such condition, the IC package P is never mounted. Accordingly, in this embodiment, the lever 51 can also attain the function as the holding means or detecting means.

Further, it is to be noted that, although, in the above fourth and fifth embodiments, an example in which a pair of levers 51 are located is handled, this is mere one preferred example and it may be possible to locate only one lever or two pairs of the levers. Furthermore, the cam portion 45a of the upper operation member 45 and the spherical projection 51b of the lever 51 abutting against the cam portion 45a may take a relationship, reverse to that mentioned above, in which the upper operation member is provided with a spherical projection and the lever is provided with a cam portion.

Further, in the fifth embodiment, it is desired that the link mechanism is disposed in relation to the side surface of the body parallel to the horizontal movement of the movable plate.

According to the fourth and fifth embodiments, it can be easily and surely known whether the IC package is mounted to its correct position or not, and furthermore, the IC package can be surely held to the position correctly mounted against external impact or vibration, thus providing an IC socket extremely effective to the practical use. Furthermore, since the present invention can be constructed by making slight change and adding slight parts to a conventional device, manufacturing cost is hardly increased. Still furthermore, since the contact between the cam and the cover can be achieved through the spherical projection, the operation can be extremely smoothly performed.

Possibility of industrial usage

As mentioned hereinbefore, the electric connector according to the present invention can be effectively utilized as an ic socket to which an ic package can be detachably mounted and applicable for the electrical connection between one electrical part and another electrical part.

What is claimed is:

1. An electrical connector in which a movable plate, which elastically deforms a contact pin when moved horizontally, is deposed to be horizontally movable on a connector body on which the contact pin is located, and an upper operation member is disposed to an upper side of the connector body to be vertically movable so that when the upper operation member is lowered, the movable plate is moved horizontally to thereby elastically deform the contact pin and then displace the same through an X-shaped link, whereby a terminal of electrical part is inserted with non-press contact state to the contact pin, and when the upper operation member is moved upward, the movable plate returns to an original position thereof and the elastic deformation of the contact pin is released, whereby the terminal of the electrical part and the contact pin are electrically contacted, said electrical connector being characterized in that said X-shaped line has substantially an X-shaped structure by pivotally connecting a pair of link members together and disposed at a portion corresponding to a body side surface portion normal to the horizontally moving direction of the movable plate and/or a body side surface portion parallel thereto, a lower end portion of one of the link members is connected to be pivotal to the connector body and a lower end portion of another one of the link members is pivotally connected to the movable plate, and one of an upper end portions of both the link members is pivotally connected to the upper operation member, wherein a plurality of said X-shaped links are disposed at portions corresponding to body side surface portions normal to the horizontally moving direction of the movable plate and/or body side surface portions parallel thereto, and a plurality of lower end portions of said another ones of the link members are pivotally connected to the movable plate with space from each other.

2. An electric connector in which a movable plate, which elastically deforms a contact pin when moved horizontally, is disposed to be horizontally movable on a connector body on which the contact pin is located, and an upper operation member is disposed to an upper side of the connector body to be vertically movable so that when the upper operation member is lowered, the movable plate is moved horizontally to thereby elastically deform the contact pin and then displace the same through a link mechanism, whereby a terminal of electrical part is inserted with non-press contact state to the contact pin, and when the upper operation member is moved upward, the movable plate returns to an original position thereof and the elastic deformation of the contact pin is released, whereby the terminal of the electrical part and the contact pin are electrically contacted, said electric connector being characterized in that said link mechanism has a structure in which a plurality of X-shaped links, each being composed of a pair of link members pivotally connected together at central portions thereof, are connected to each other in a plurality of stages, and are disposed at portions corresponding to body side surface portions normal to the horizontally moving direction of the movable plate and/or body side surface portions parallel thereto, and a lower end portion of one of the link members of the lowermost stage X-shaped link is pivotally connected to the connector body a lower end portion of another one of the link members thereof is pivotally connected to the movable plate and one of upper end portions of the uppermost stage X-shaped link is pivotally connected to the upper operation member.

3. An electrical connector according to claim 2, wherein a plurality of said link mechanisms are disposed at portions corresponding to side surface portions along rectangular horizontal movement of the movable member, and a plurality of lower end portions of said another link members of the lowermost X-shaped link are pivotally connected to the movable plate with space from each other.

4. An electrical connector according to any one of claims 1 to 3, wherein said X-shaped link has one link member to which a slit is formed and another one link member is inserted into the slit and then connected to be pivotal by means of a central coupling pin.

5. An electrical connector according to any one of claims 1 to 3, wherein a plurality of positioning bosses are formed to the connector body so as to extend upward, said positioning bosses being inserted into idle insertion portions formed to the movable plate to be projected upward therefrom, upper end portions of the positioning bosses are fitted to an upper plate disposed so as to cover an upper side of the movable plate to thereby support the upper plate, a through hole, through which a terminal of the electrical part is inserted, is formed to the upper plate, and the idle insertion portion is set in size capable of allowing the movable plate to be horizontally movable without interfering with the positioning bosses.

6. An electrical connector according to any one of claims 1 to 3, wherein a lever is disposed to the connector body to be pivotal, said lever being rotated by a vertical movement of the upper operation member, and when the electrical part is placed to a correct position on the connector body, the lever locks the electrical part, whereas when the electrical part is placed to an incorrect position on the connector body, the lever does not lock the electrical part.

* * * * *

UNITED STATES PATENT AND TRADEMARK OFFICE
CERTIFICATE OF CORRECTION

PATENT NO. : 6,106,319  
DATED : August 22, 2000  
INVENTOR(S) : Masami Fukunaga and Kentaro Mori Page 1 of 1

It is certified that error appears in the above-identified patent and that said Letters Patent is hereby corrected as shown below:

Title page,  
Left column, [22] PCT Filed, [Sept. 10, 1997], please change to -- Oct 9, 1997. --

Abstract,  
Line 13, right column, please change [supper] -- to upper. --

Column 5,  
Line 26, please change [clever] to -- lever. --

Column 8,  
Line 13, please change [$f\ Æ$] to -- $\theta$ --.

Column 10,  
Line 41, please change [$f\ Æ$] to -- $\theta$ --.

Column 11,  
Line 22, please delete [In] before side.

Column 12,  
Line 19, please change [line] to -- link. --

Signed and Sealed this

Thirtieth Day of October, 2001

Attest:

NICHOLAS P. GODICI  
Acting Director of the United States Patent and Trademark Office

*Attesting Officer*